United States Patent [19]

Tomita et al.

[11] Patent Number: 5,281,835
[45] Date of Patent: Jan. 25, 1994

[54] SEMI-CUSTOM INTEGRATED CIRCUIT DEVICE

[75] Inventors: Masayoshi Tomita; Tadahiro Saitoh, both of Kawasaki; Kiyokazu Hasegawa, Yokohama; Noboru Kosugi, Kawasaki, all of Japan

[73] Assignee: Fujitsu Limited, Kawasaki, Japan

[21] Appl. No.: 825,733

[22] Filed: Jan. 27, 1992

Related U.S. Application Data

[63] Continuation of Ser. No. 537,833, Jun. 13, 1990.

[30] Foreign Application Priority Data

Jun. 14, 1989 [JP] Japan .................. 1-149473

[51] Int. Cl.$^5$ .............. H01L 29/78; H01L 27/10
[52] U.S. Cl. ................... 257/204; 257/206; 257/207
[58] Field of Search ............. 357/45, 42, 41; 257/204, 206, 207

[56] References Cited

U.S. PATENT DOCUMENTS

| | | | |
|---|---|---|---|
| 4,737,838 | 4/1988 | Watanabe | 457/51 |
| 4,839,710 | 6/1989 | Holzapfel | 357/45 |
| 4,914,546 | 4/1990 | Alter | 357/51 |

FOREIGN PATENT DOCUMENTS

| | | | |
|---|---|---|---|
| 0131464 | 1/1985 | European Pat. Off. | 357/45 |
| 0189183 | 7/1986 | European Pat. Off. | |
| 59-108328 | 6/1984 | Japan | 357/45 |
| 60-18932 | 1/1985 | Japan | 357/45 |
| 60-66449 | 4/1985 | Japan | |
| 60-240139 | 11/1985 | Japan | |
| 01-7536 | 1/1989 | Japan | 357/45 |

Primary Examiner—Jerome Jackson
Attorney, Agent, or Firm—Armstrong, Westerman, Hattori, McLeland & Naughton

[57] ABSTRACT

A semi-custom integrated circuit comprises a basic cell array comprising a plurality of basic cells aligned in a first direction, the basic cells comprising a transistor unit, a capacitor unit and a resistor unit arranged in a second direction perpendicular to the first direction. The transistor unit is positioned between the capacitor unit and the resistor unit. The transistor unit has a terminal portion for connection of wiring, the capacitor unit having a terminal portion for connection of wiring, the resistor unit having a terminal portion for connection of wiring. The terminal portions of said transistor unit, capacitor unit and resistor unit are aligned along a line.

25 Claims, 12 Drawing Sheets

PRIOR ART

SEMI-CUSTOM INTEGRATED CIRCUIT DEVICE

This application is a continuation of application Ser. No. 537,833 filed Jun. 13, 1990.

BACKGROUND OF THE INVENTION

The present invention relates to a semi-custom integrated circuit apparatus capable of discretionally forming a gate array of a digital circuit (logic circuit), a gate array of an analog circuit, or a gate array on which a digital circuit and an analog circuit are mixed.

DESCRIPTION OF THE RELATED ART

In the present art, a gate array on which a logic circuit is provided forms the main current. Furthermore, in a recently developed device, a gate array on which an analog circuit is provided has both a digital circuit and an analog circuit formed on the gate array.

Generally, it is necessary in an analog circuit to provide a resistor or a capacitor in addition to a transistor.

The number of prior-art devices having the gate array in which a digital circuit and an analog circuit are mixed is very small. However, an example of this type of device is the invention disclosed in Japanese Patent Disclosure sho 59-1083228, which has a capacitor formed in a wire layer of the cell array.

Figure 1:
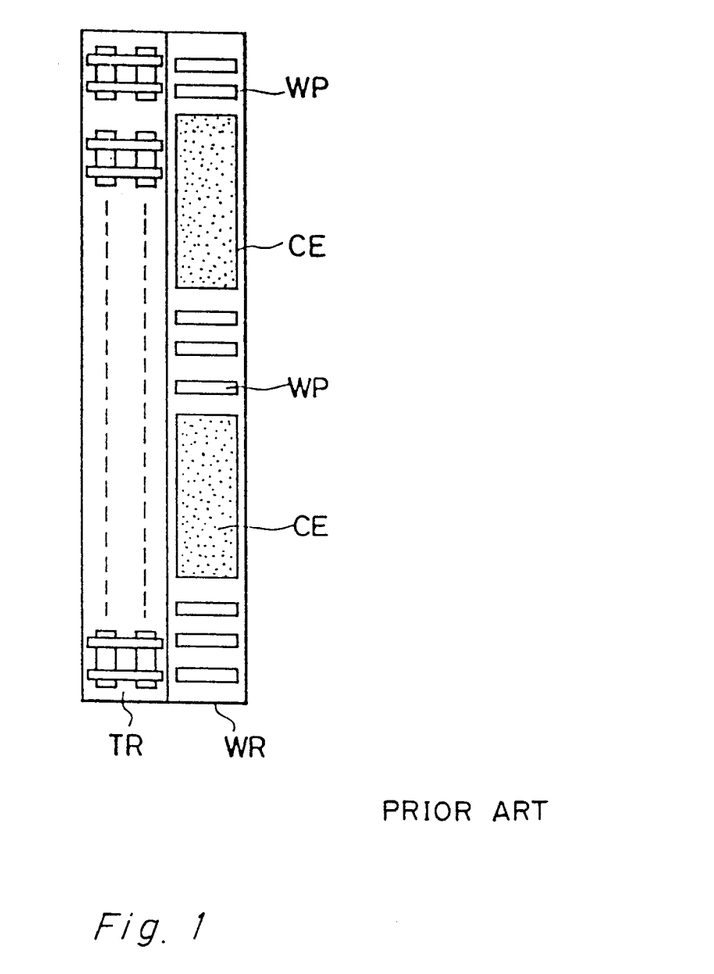
FIG. 1 shows a plan view of the main part of a cell array in a semi-custom IC disclosed in the prior art.

FIG. 1 represents a plan view of a main part of a cell array in a semi-custom IC disclosed in this Japanese Patent Disclosure.

In FIG. 1, TR represents a transistor region, WR a wiring region, WP a wiring poly-silicon film and CE a capacitor poly-silicon film.

One electrode of the capacitor is formed of the capacitor poly-silicon film CE and the other electrode of the capacitor is formed of an impurity diffusion region with a bulk form. A resistor can be formed by providing two electrodes for the impurity diffusion region.

In a semi-custom integrated circuit, respective cells must have a rectangular shape to enable the arrangement and wiring to be designed by a computer. Respective regions with a bulk form are fixed. Only the wiring is changed to enable the device to be provided with different functions.

As described above, where a digital circuit is mixed with an analog circuit, the above condition which includes provision of a resistor and capacitor, which are essential for the construction of an analog circuit, should be maintained.

For this purpose, it is important to provide a layout which includes a resistor and a capacitor. Needless to say, the prior art invention disclosed in the above patent disclosure is limited to the idea in which a digital circuit and an analog circuit are merely mixed. Therefore, in this prior art, the arrangement of the resistor and capacitor is not regular. Thus, it requires an unnecessarily large space, thereby drastically decreasing the number of cells with an analog function which can be provided in the cell. In particular, this prior art does not clearly specify the wiring and thus does not solve the wiring problem. Thus, as can be seen from the above, the prior art has serious problems which may make it impossible to realize a gate array in which a digital circuit and analog circuit can be mixedly formed.

SUMMARY OF THE INVENTION

An object of the present invention is to provide a semi-custom integrated circuit device capable of mounting a digital circuit and an analog circuit either independently or in a mixed manner. This is achieved by forming a basic cell with a combination of a transistor unit, a resistor unit and a capacitor unit.

A feature of the present invention resides in a semi-custom integrated circuit comprising a basic cell array comprising a plurality of basic cells aligned in a first direction, each of the basic cells comprising a transistor unit, a capacitor unit and a resistor unit arranged in a second direction perpendicular to the first direction, the transistor unit being positioned between the capacitor unit and the resistor unit, the transistor unit having a terminal portion for connection of wiring, the capacitor unit having a terminal portion for connection of wiring, the resistor unit having a terminal portion for connection of wiring, and the terminal portions of the transistor unit, capacitor unit and resistor unit being aligned along a line.

In the semi-custom integrated circuit a plurality of said cell arrays are arranged in a second direction crossing a wiring region.

In the semi-custom integrated circuit an unused region on the capacitor unit or transistor unit is used for the arrangement of an interconnection wiring between said basic cells.

In the semi-custom integrated circuit the transistor unit comprises a source region and a drain region arranged in the first direction, a gate electrode provided between the source region and drain region and extending in the second direction, and the gate electrode having terminal portions in the terminal region.

In the semi-custom integrated circuit the resistor unit comprises a polysilicon layer formed on an insulating film covering a semiconductor substrate and extending in the second direction and having a terminal portion, the capacitor unit comprising a first electrode formed on the insulating film for covering the semiconductor substrate, an insulating film for covering a first electrode and a second electrode formed on the insulating film, the first and second electrodes having respective terminal portions.

In the semi-custom integrated circuit the transistor unit comprises a p-channel MIS-transistor pair and an n-channel MIS-transistor pair arranged in the second direction. The p-channel MIS transistor pair comprises a first p-type region a second p-type region, and a third p-type region, which are arranged in the first direction; a first gate electrode arranged between the first p-type region and the second p-type region and extending in the second direction; and a second gate region arranged between the second p-type region and the third p-type region and extending in the second direction. The n-channel MIS transistor pair comprises a first n-type region a second n-type region, a third n-type region, which are arranged in the first direction; a third gate electrode arranged between the first n-type region and the second n-type region and extending in the second direction; and a fourth gate electrode arranged in the second n-type region and the third n-type region and extending in the second direction. The resistor unit comprises a first resistor element and a second resistor element arranged in the first direction and extending in said second direction, the capacitor unit electrode. Terminal portions of the first and the third gate electrodes, the first resistor element, and the first capacitor electrode are aligned along a line. Terminal portions of the second and fourth gate electrodes, the second resistor element, and the second capacitor electrode are aligned with each other.

In the semi-custom integrated circuit, the first and third gate electrodes are formed integrally and the second and fourth gate electrodes are formed integrally.

In the semi-custom integrated circuit the transistor unit comprises first and second p-channel MIS transistor pairs and first and second n-channel MIS transistor pairs arranged in the second direction. The first and second p-channel MIS transistor pairs each comprise a first p-type region, a second p-type region and a third p-type region arranged in the first direction; a first gate electrode arranged between the first p-type region and the second p-type region and extending in the second direction; and a second gate electrode arranged between the second p-type region and the third p-type region and extending in the second direction. The first and second n-channel MIS transistor pairs each have a first n-type region, a second n-type region and a third n-type region arranged in the first direction; a third gate region arranged between the first n-type region and the second n-type region and extending in the second direction; and a fourth gate electrode arranged between the second n-type region and the third n-type region and extending in the second direction. The resistor unit has a first resistor element and a second resistor element arranged in the first direction and extending in the second direction, and the capacitor unit comprises a first capacitor electrode and a second capacitor electrode. Terminal portions of the first and third gate electrodes, the first resistor element and the first capacitor electrode are aligned along a straight line. Terminal portions of the second and fourth gate electrodes of the second resistor element and the second capacitor electrode are aligned along a straight line.

In the semi-custom integrated circuit, the first and second p-channel MIS transistor pairs or said first and second p-channel MIS transistor pairs are arranged adjacent to each other.

In the semi-custom integrated circuit a plurality of transistor units forms a digital circuit through an interconnection and a plurality of resistor units and capacitor units forms an analog circuit through an internal connection.

PREFERRED EMBODIMENT OF THE PRESENT INVENTION

Figure 2A:
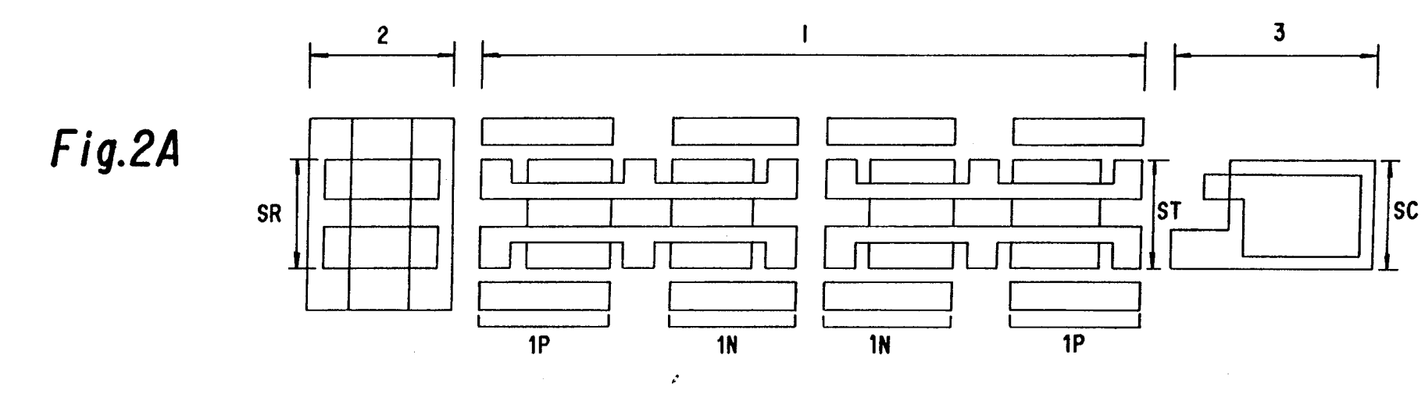
FIGS. 2A and 2B, respectively show a plan view of the main part of a basic cell for explaining the principle of the present invention and an equivalent circuit thereof.
Figure 2B:
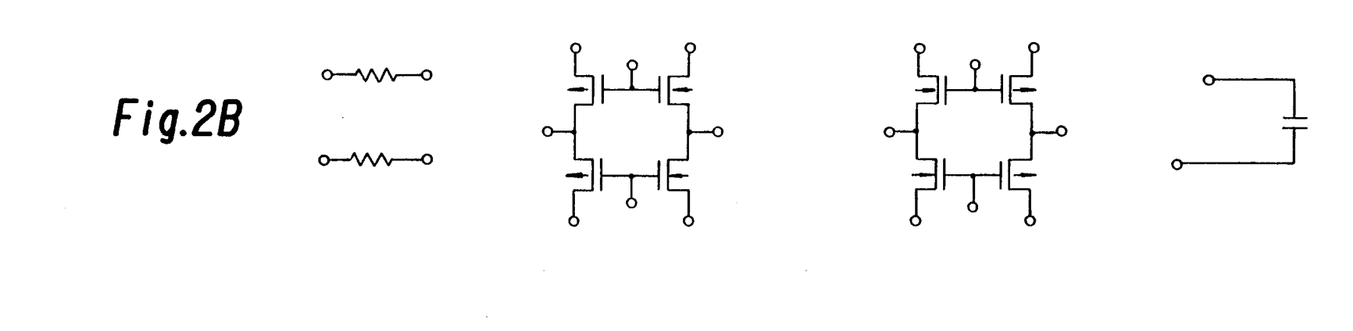

FIGS. 2A and 2B, respectively, show a plan view of a main part of a basic cell for explaining the principle of the present invention and equivalent circuit thereof.

In the drawing, 1 is a transistor unit, 1p a p-channel transistor portion, 1n an n-channel transistor portion, 2 a resistor unit, 3 a capacitor unit, ST the width of the transistor unit 1, SR the width of the resistor unit 2, and SC the width of the capacitor unit 3.

As described above, in the present invention, transistor unit 1, resistor unit 2, and capacitor unit 3 are combined to form a single basic cell and the basic cell is arranged as an array.

The basic cell shown in FIG. 2A provides resistor unit 2 on the left side of transistor unit 1 and capacitor unit 3 on the right side thereof. The structure of the basic cell can be modified in various ways and the arrangement of the basic cell can be selected appropriately as necessary. The number of transistors may be one or more than one.

FIGS. 3 to 7 represent explanatory plan views of the main part of an array for explaining the arrangement of the resistor 2 and the capacitor unit 3 and an array of the basic cell. The same reference numbers as used in FIG. 2A represent the same portions or the same meanings.

Figure 3:
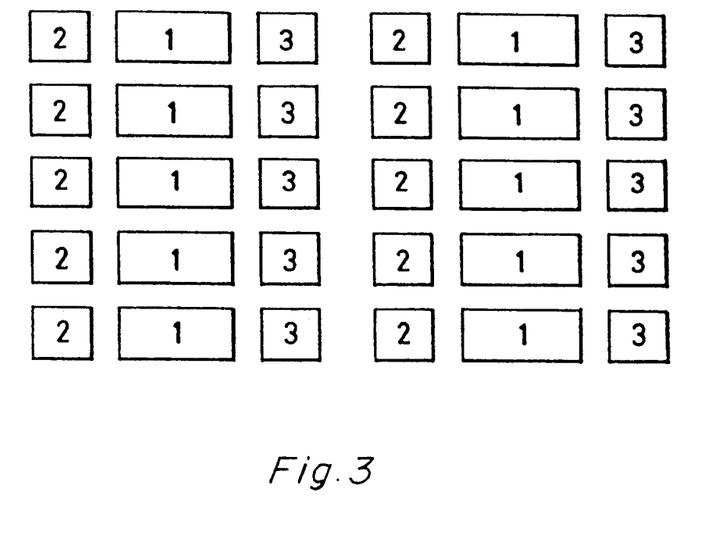
FIG. 3 shows a plan view of the main part of an array for explaining one embodiment of an arrangement of a resistor unit and a capacitor unit and that of a basic cell.

FIG. 3 represents an array in which the basic cell shown in FIG. 2A is sequentially arranged.

Figure 4:
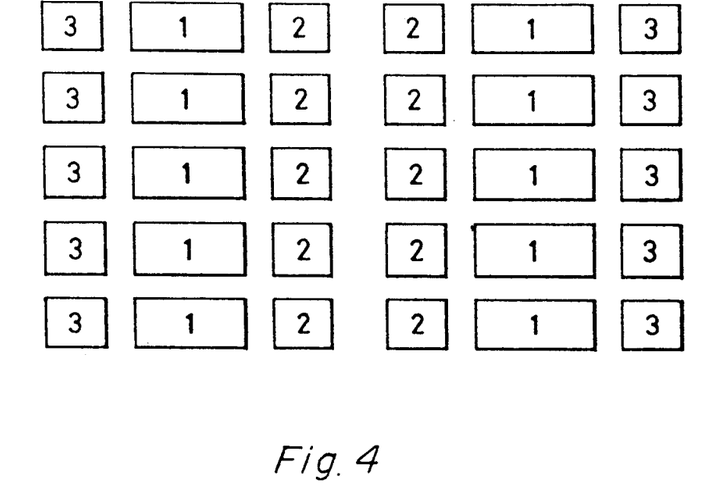
FIG. 4 shows a plan view of the main part of an array for explaining another embodiment of an arrangement of a resistor unit and a capacitor unit and that of a basic cell.

FIG. 4 represents an array of a basic cell in which the positions of the capacitor unit 3 and resistor unit 2 are exchanged with those of the resistor unit 2 and capacitor unit 3 of the basic cell shown in FIG. 3, such array of the basic cell being provided in one column. The array of the basic cell shown in FIG. 3 is provided in the adjacent column.

Figure 5:
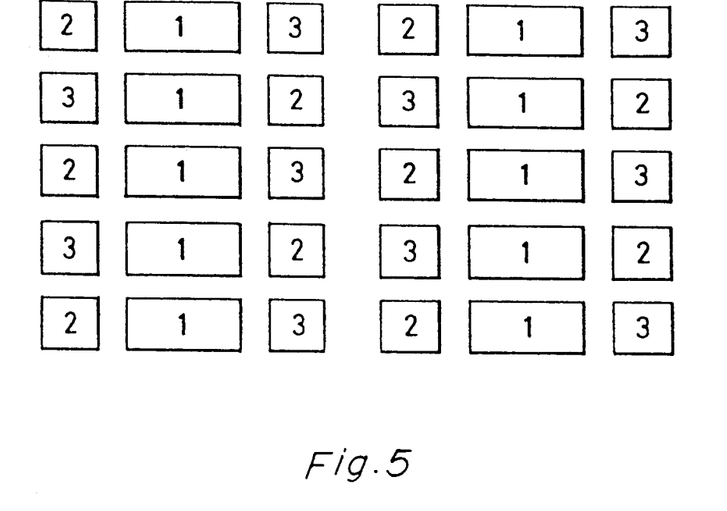
FIG. 5 shows a plan view of the main part of an array for explaining a further embodiment of an arrangement of a resistor unit and a capacitor unit and that of a basic cell.

FIG. 5 represents an array in which the basic cell shown in FIG. 3 and the basic cell shown in a left column of FIG. 4 are provided in turn.

Figure 6:
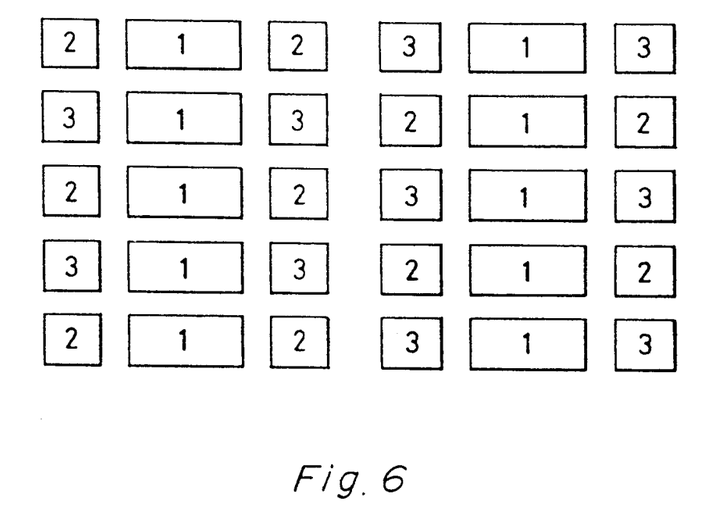
FIG. 6 shows a plan view of the main part of an array for explaining a still further embodiment of the arrangement of a resistor unit and a capacitor unit and that of a basic cell.

FIG. 6 shows an array in which a basic cell having resistor units 2 provided on both sides of the transistor unit 1 and a basic cell having capacitor units 3 provided on both sides of the transistor unit 1 are arranged in turn and the basic cell array on the left side is shifted from the basic cell array on the right side by one basic cell.

Figure 7:
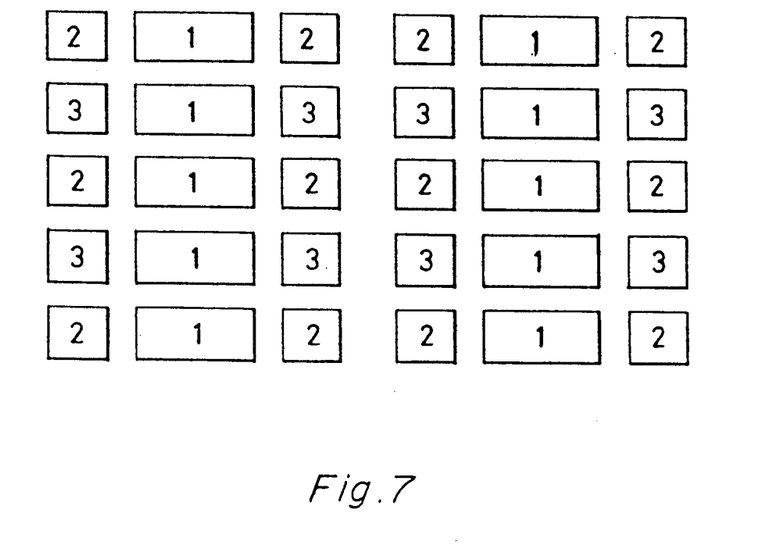
FIG. 7 shows a plan view of the main part of an array for explaining other embodiment of an arrangement of a resistor unit and a capacitor unit and that of a basic cell.

FIG. 7 represents an array in which the basic cell array on the left side becomes the same basic cell array on the right side in the array relationship shown in FIG. 6.

In the basic cell shown in FIGS. 3 to 7, the width ST of the transistor unit 1 is equal to the width ST of resistor unit 2 and the width SC of capacitor unit 3, but the widths ST, SR and SC can be properly selected within a scope facilitating a computer aided design.

Figure 8:
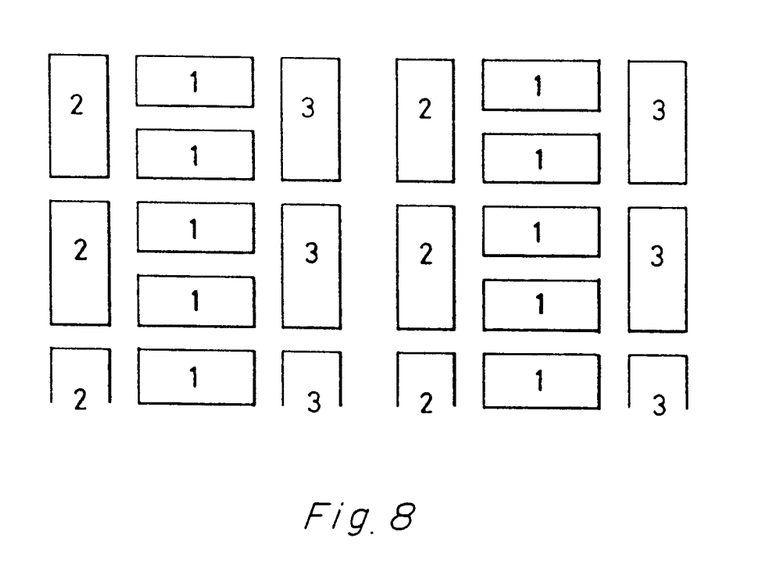
FIG. 8 shows a plan view of the main part of an array for explaining an embodiment in which the width of a transistor unit is different from that of the resistor unit or the capacitor unit.
Figure 9:
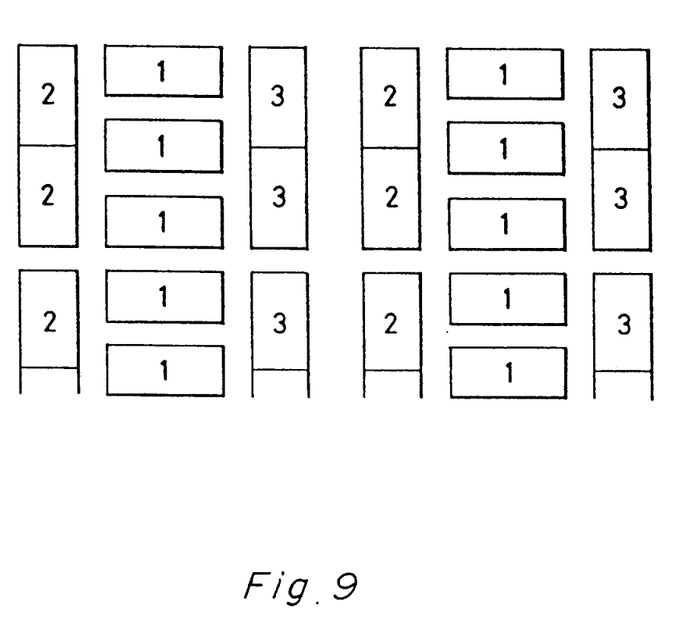
FIG. 9 shows a plan view of the main part of an array for explaining another embodiment in which the width of the transistor unit is different from that of the resistor unit or capacitor unit, FIGS. 10A and 10B, respectively, show a plan view of the main part of the basic cell for explaining the embodiment of the present invention and an equivalent circuit thereof.

FIGS. 8 and 9 are explanatory main part plan views relating to an array for explaining a case in which the width SR of resistor unit 2 and the width SC of capacitor unit 3 are not equal to the width ST of transistor unit 1. The reference numbers shown in FIGS. 8 and 9, which are the same as those shown in FIGS. 3 to 7, represent the same part or the same meaning.

In FIG. 8, the width SR of the resistor unit 2 and the width SC of the capacitor unit 3 are a positive integer times the width ST the of transistor unit 1.

FIG. 9 represents an array in which the width SR of resistor unit 2 and the width SC of capacitor unit 3 are a positive integer times half the width ST of the transistor unit 1.

Where the gate array is of a channel type, the basic cell forms the transistor unit 1 in the transistor area TR and forms the resistor unit 2 and capacitor unit 3 so that they are buried in the wiring region WR. If the gate array is of a channelless type (i.e. a sea of gate: SOG), the basic cell is provided over the entire area.

As is clear from the above description, in the semicustom integrated circuit device according to the present invention as viewed in the plan direction, a resistor unit (for example, the resistor unit 2) or a capacitor unit (for example, the capacitor unit 3) is provided on both sides of a transistor unit (for example, the transistor unit 1). The vertical width of these units is either the same as the vertical width (for example, the width ST) of the transistor unit, a positive integer times the vertical width of the transistor unit or a positive integer times half the vertical width of the transistor unit. This assembly forms a basic cell. In addition, a transistor unit may be provided in the transistor region and the resistor or capacitor units may be provided in the wiring region provided beside the transistor region.

By this means, a semi-custom integrated circuit apparatus on which a digital circuit and an analog circuit can be independently or mixedly mounted is realized and the wire for completing an integrated circuit device which can be provided to a user can be dealt with by using the conventional technology.

Figure 10A:
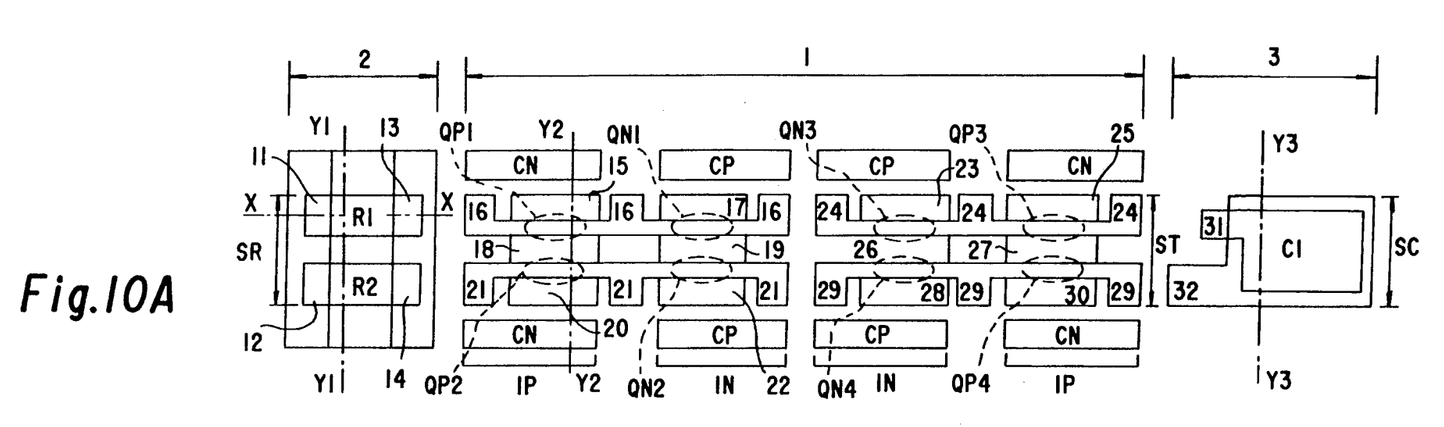
Figure 10B:
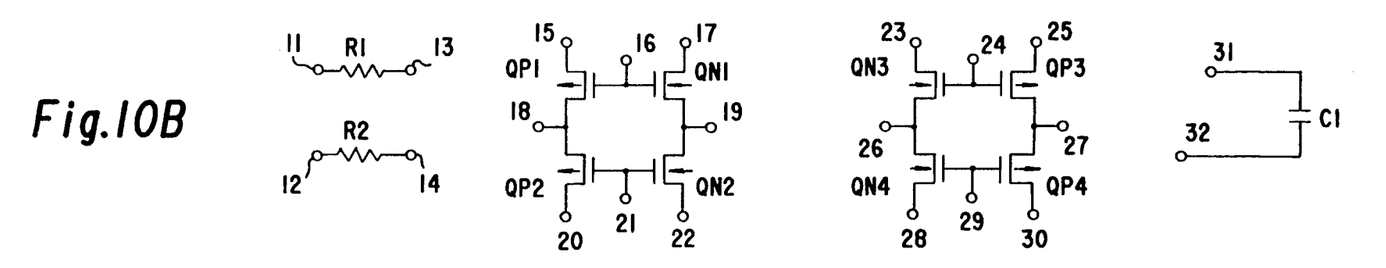

FIGS. 10A and 10B, respectively, represent a plan view and an equivalent circuit view of a main part of a basic cell for explaining an embodiment of the present invention and the same references used in FIGS. 2 to 9 represent the same parts or meanings.

The present embodiment is basically the same as the basic cell explained by referring to FIG. 2. Needless to say, the symbols in FIG. 9A correspond to the symbols shown in FIG. 9B.

In FIGS. 10A and 10B, 11 to 32 indicate terminals, R1 and R2 resistors, QP1 and QP2 p-channel and QN2 n-channel transistors, QP3 and QP4 p-channel transistors, QN3 and QN4 n-channel transistors, C1 a capacitor, CP a contact pattern for connection to a p-type substrate and CN a contact pattern for connection to an n-type substrate. Respective transistors in FIGS. 10A and 10B are represented by their gates and symbols are given to their gates.

An impurity diffused region R1 of the resistor unit 2 is to form a resistor R1. The regions 11 and 13 are from terminals 11 and 13 of the resistor R1. Regions 16 and 21 are to form gate terminals 16 and 21 of the transistors QP1 and QP2. Regions 15 and 20 are to form source terminals 15 and 20. Region 18 is to form drain electrode 18. Regions 31 and 32 are to form terminals 31 and 32 of capacitor C1.

The regions for terminals 11, 13, 16 and 24 are aligned with each other. The regions for terminals 12, 14, 21, 29 and 32 are aligned with each other. Therefore, terminals of the resistor unit 2, transistor unit 1 and capacitor unit 3 are aligned with each other in a horizontal direction, for example, along a line of a grid (not shown). Contact patterns CN and CP are also aligned in a horizontal direction. Some of the terminals or contact patterns may be aligned in a vertical direction. Therefore, the embodiment shown in FIG. 10A facilitates computer aided design and wiring.

Figure 11:
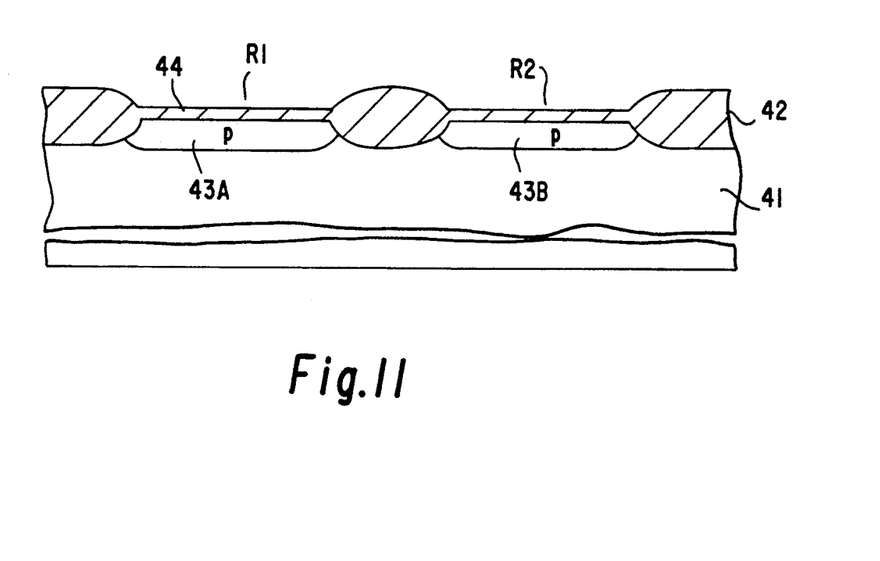
FIG. 11 is a sectional view of the main part of the embodiment along the line Y1—Y1 shown in FIG. 10A.

FIG. 11 is a sectional view of a main part along the line Y1—Y1 shown in FIG. 10A and the same reference numbers as in FIGS. 2 and 10A represent the same parts as in FIGS. 2 to 10A.

In FIG. 11, 41 indicates an n type semiconductor substrate, 42 a field insulating film comprising Silicon dioxide ($SiO_2$), 43A and 43B are p-type resistor regions and 44 an insulating film formed simultaneously with a gate insulating film.

Figure 12:
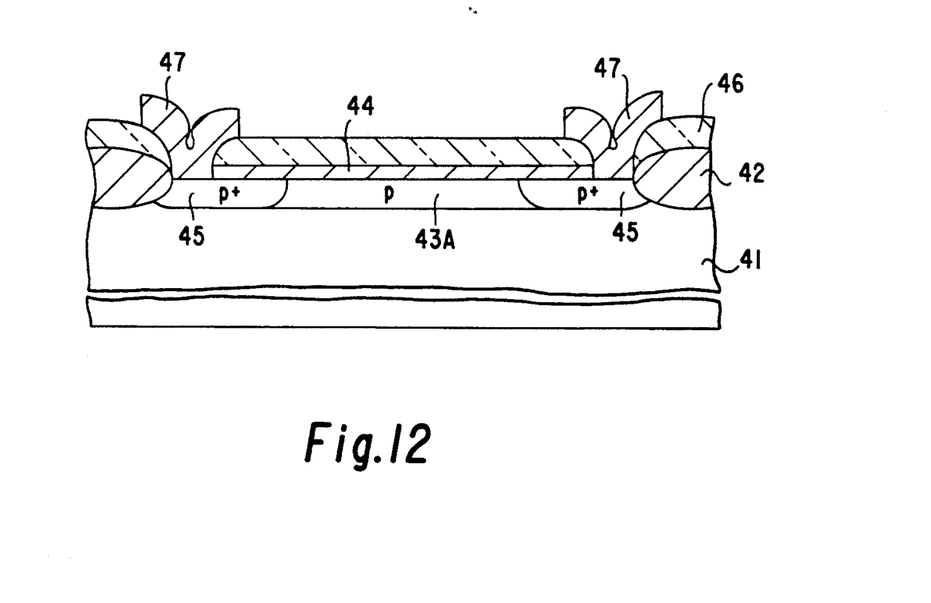
FIG. 12 shows a sectional side view of the main part of the embodiment along the line X—X shown in FIG. 10A.

FIG. 12 is a sectional view of the main part along the line x—x shown in FIG. 10A and the same references as used in FIG. 2 to 11 represent the same parts or the same meanings.

In FIG. 12, 45 indicates a $p^+$-type electrode contact region, 46 a phosphosilicate glass(PSG) film and 47 an electrode.

Figure 13:
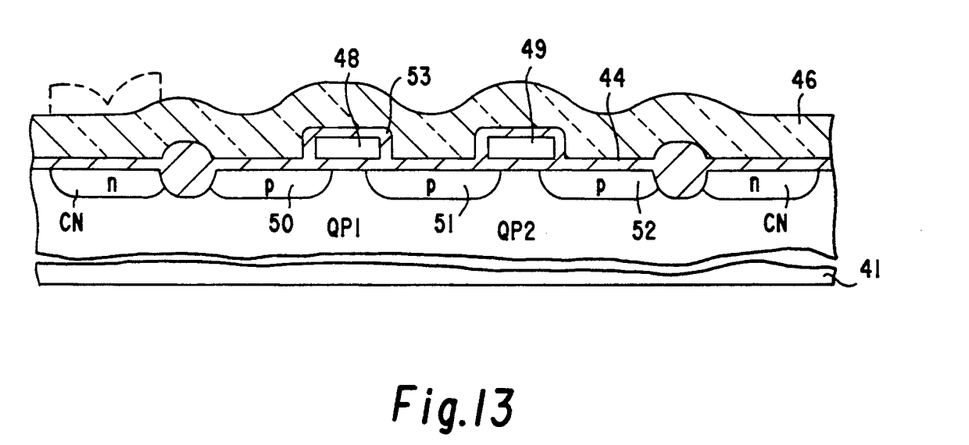
FIG. 13 is a sectional view of the main part of the embodiment along the line Y2—Y2 shown in FIG. 10A.

FIG. 13 is a sectional view of the main part along the line Y2—Y2 shown in FIG. 10A. The same reference numbers as used FIGS. 2 to 12 represent the same parts or the same meanings.

In FIG. 13, 48 indicates a polisilicon gate electrode of transistor QP1, 49 a polisilicon gate electrode of transistor QP2, 50 a p-type source region of transistor QP1 and QP2, 51 a p-type drain region of transistors Q1, 52 a p-type drain region of transistor AP2, and 53 a betweenlayer insulating film comprising $SiO_2$.

Figure 14:
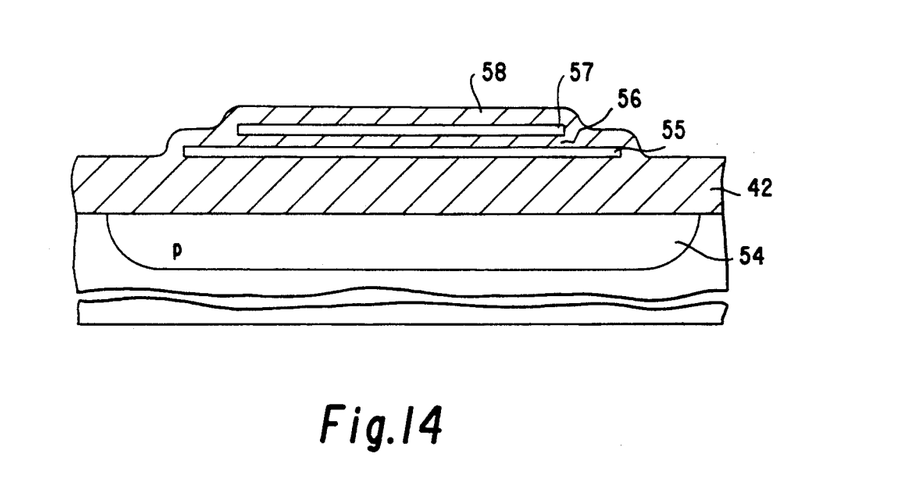
FIG. 14 shows a sectional view of the main part of the embodiment along the line Y3—Y3 shown in FIG. 10A.

FIG. 14 is a sectional view of the main part along the line Y-3 shown in FIG. 10A. The same reference numbers as in FIGS. 2 to 13 represent the same parts or the same meanings.

In FIG. 14, 54 indicates a p-type region, 55 a capacitor electrode of polysilicon, 56 a capacitor dielectric film comprising $SiO_2$, 57 a capacitor electrode of a polysilicon and 58 an insulating film.

As described above, when a capacitor is formed of a 2-layer configuration comprising polysilicon films, the accuracy of the capacitance is higher than that of a capacitor formed by bulk polysilicon and a single-layer polysilicon film. Where a high-precision capacitor or resistor is obtained, it becomes possible to form a D/A converter of the R-string type or an A/D converter of the sequential comparison type by using the cell of the present invention. Therefore, an integrated circuit unit device can be completed within a short period in the same manner as an ordinary gate array.

Figure 15:
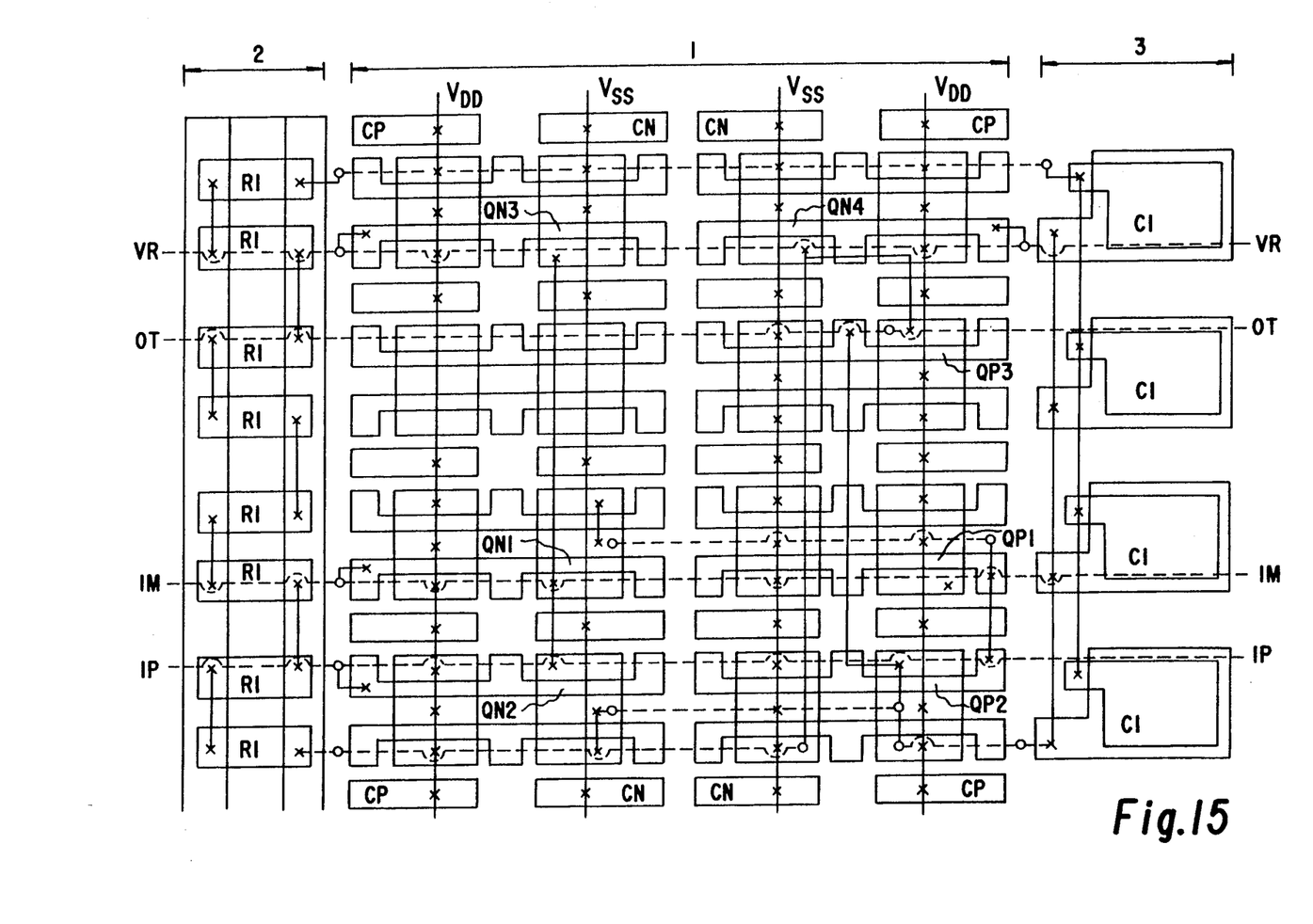
FIGS. 15 shows a plan view of the main part of the embodiment for explaining a pattern layout of an operational amplifier to which the present invention is applied.
Figure 16:
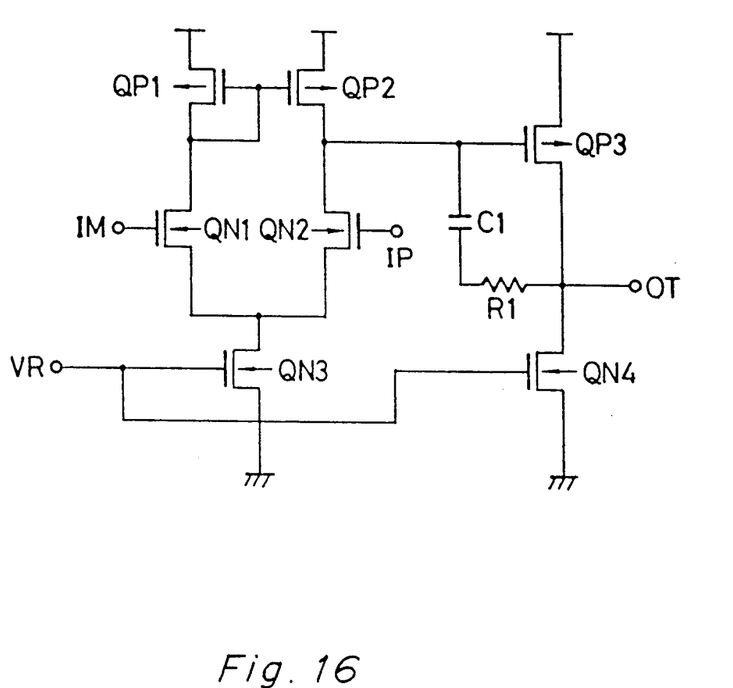
FIG. 16 shows an equivalent circuit of the operational amplifier shown in FIG. 15 as the pattern layout and, FIG. 17 shows a plan view of the main part of the whole bulk for explaining the gate array according to the present invention.

FIGS. 15 and 16 represent a plan view of the main part for explaining the pattern layout of an operational amplifier formed by the basic cell of the present invention. The reference numbers as used in FIGS. 1 to 13 represent the same parts or the same meanings.

In FIGS. 15 and 16, $V_{DD}$ represents a positive power source level, Vss a ground side power source level, IM a −difference input, IP a +difference input, VR a bias input and OT an output. The wire represented by a solid line is made of metal wire and it is in the first layer Al. The wire represented by a dashed line is also made of metal and is in the second layer Al. The x mark indicates the contact portion between the first-layer metal wire and the bulk, and the O mark designates the contact point between the first-layer metal wire and the second-layer metal wire.

As is clear from the drawings, the basic cell in this embodiment is the same as that used for the explanation in FIGS. 2A and 2B. Transistor unit 1, resistor unit 2 and capacitor unit 3 can be wired by computer-aided automatic design.

Figure 17:
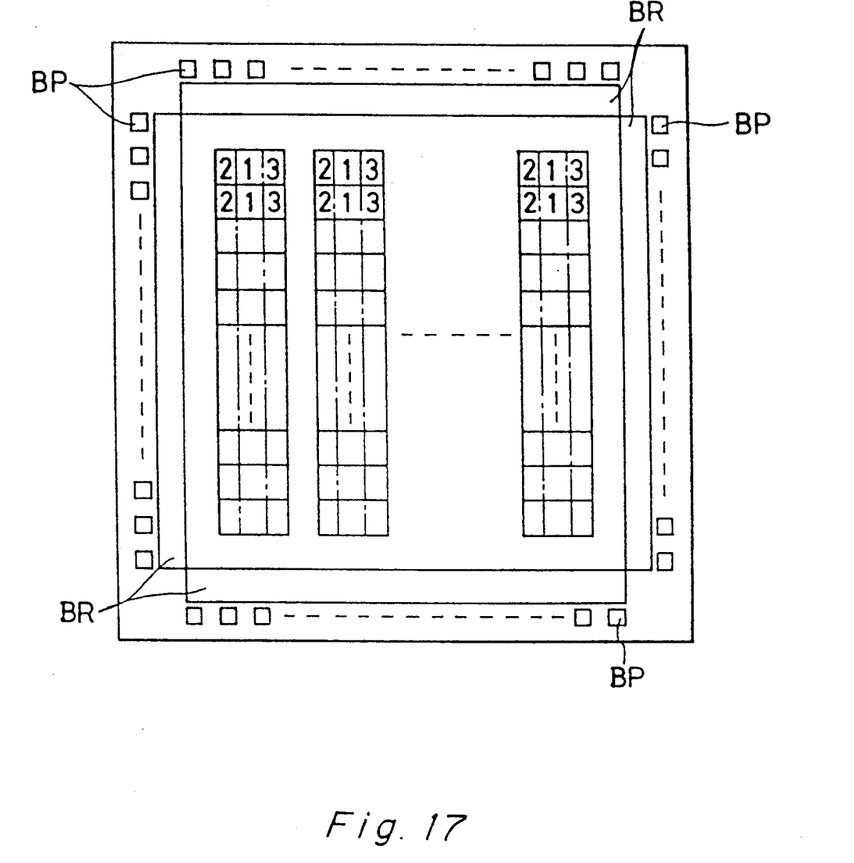

FIG. 17 is an explanatory plan view of the main part representing the whole bulk for explaining a gate array embodying the present invention. The same reference numbers used in FIG. 3 represent the same portions or the same meanings.

In FIG. 17, BR represents an input and output buffer and BP an input and output bonding pad.

In FIG. 17, when the gate array is used only for a logic circuit, resistor unit 2 and capacitor unit 3 in the basic cell need not be used. Furthermore, if the gate array is used only for an analog circuit, the whole basic cell can be used. If they are selectively embodied, a gate array in which a logic circuit and an analog circuit are mixed can be realized. When the gate array is formed only by the logic circuit, it does not cause any problem even if a metal wire passes over resistor unit 2 or capacitor unit 3.

The basic cell of the present invention can also form an A/D or D/A converter, analog switch, and a comparator, for example.

The basic cell of the present invention may be used for a full-custom integrated circuit device and a regular standard integrated circuit device.

In the semi-custom integrated circuit device according to the present invention, as viewed in the plan direction, a resistor unit or a capacitor unit are provided on both sides of the transistor unit to form a basic array. The vertical width of these units is either the same as that of the transistor unit, a positive integer times the vertical width of the transistor unit, or a positive integer times half the vertical width of the transistor unit. In addition, the transistor unit may be provided on the transistor region and the resistor unit or capacitor unit may be provided on the region formed beside the transistor region.

With this configuration, the digital circuit and the analog circuit can be independently or mixedly mounted, thereby providing a semiconductor integration circuit. The wiring required to complete an integrated circuit device to be provided to a user, can be dealt with by automatic computer aided design using the conventional technology.

What is claimed is:

1. A semi-custom integrated circuit comprising:
   a basic cell array including a plurality of basic cells aligned in a first direction, said basic cells having a transistor unit, a capacitor unit and a resistor unit arranged in a second direction perpendicular to said first direction,
   said transistor unit being positioned between said capacitor unit and said resistor unit,
   said transistor unit having a terminal portion for connecting of wiring,
   said capacitor unit having a terminal portion for connection of wiring,
   said resistor unit having a terminal portion for connection of wiring, and
   the terminal portions of said transistor unit, capacitor unit and resistor unit being aligned along a line,
   said capacitor unit including a first electrode formed on a first insulating film which covers a semiconductor substrate, a second electrode, and a second insulating film formed between said first and second electrodes, said first and second electrodes having respective terminal portions.

2. The semi-custom integrated circuit according to claim 1, wherein
   a plurality of said cell arrays are arranged in a second direction crossing a wiring region.

3. The semi-custom integrated circuit according to claim 1, wherein an unused region on said capacitor unit or transistor unit is used for the arrangement of an interconnection wiring between said basic cells.

4. The semi-custom integrated circuit according to claim 1, wherein
   said transistor unit comprises:
      a source region and a drain region arranged in said first direction,
      a gate electrode provided between said source region and said region and extending in said second direction, and
      said gate electrode having terminal portions in said terminal region.

5. The semi-custom integrated circuit according to claim 1, wherein
   said resistor unit comprises a polysilicon layer formed on an insulating film covering a semiconductor substrate and extending in said second direction and having a terminal portion.

6. The semi-custom integrated circuit according to claim 1, wherein
   said transistor unit comprises a p-channel MIS-transistor pair and an n-channel MIS-transistor pair arranged in said second direction,
   said p-channel MIS transistor pair comprises a first p-type region a second p-type region, and a third p-type region, which are arranged in said first direction, a first gate electrode arranged between said first p-type region and said second p-type region and extending in said second direction and said second gate region arranged between said second p-type region and said third p-type region and extending in said second direction,
   said n-channel MIS transistor pair comprises a first n-type region a second n-type region, and a third n-type region, which are arranged in said first direction, a third gate electrode arranged between said first n-type region and said second n-type region and extending in said second direction, and a fourth gate electrode arranged in said second n-type region and said third n-type region and extending in said second direction, said resistor unit comprises a first resistor element and a second resistor element arranged in said first direction and extending in said second direction, said capacitor unit has a first capacitor electrode and a second capacitor electrode, terminal portions of the first and the third gate electrodes, said first p-type region, said first n-type region, said first resistor element, and said first capacitor electrode are aligned along a line, terminal portions of the second, and fourth gate electrode, said third p-type region, said third n-type region, said second resistor element, and said second capacitor electrode are aligned with each other, and said second p-type region and said second n-type region are aligned along a line.

7. The semi-custom integrated circuit according to claim 6, wherein said first and third gate electrodes are formed of an integrated electrode and said second and fourth electrodes are formed of an integrated electrode.

8. The semi-custom integrated circuit according to claim 1, wherein said transistor unit comprises first and second p-channel MIS transistor pairs and first and second n-channel MIS transistor pairs arranged in said second direction, said first and second p-channel MIS transistor pairs each comprise a first p-type region, a second p-type region and a third p-type region arranged in said first direction, a first gate electrode arranged between said first p-type region and said second p-type region and extending in said second direction, and a second gate electrode arranged between said second p-type region and said third p-type region and extending in said second direction, said first and second n-channel MIS transistor pair each has a first n-type region, a second n-type region and a third n-type region arranged in said first direction, a third gate region arranged between said first n-type region and said second n-type region and extending in said second direction, and a fourth gate electrode arranged between said second n-type region and said third n-type region and extending in said second direction, said resistor unit has a first resistor element and a second resistor element arranged in said first direction and extending in said second direction, said capacitor unit comprises a first capacitor electrode and a second capacitor electrode, terminal portions of said first and third gate electrode, said first n- and said first n- said first resistor element and said first capacitor electrode are aligned along a straight line, terminal portions of said second and fourth gate electrodes, said second resistor element and said second capacitor electrode are aligned along a straight line, and said second p-type region and said second n-type regions of said first and second p-channel MIS transistor pair and said first and second n-channel MIS transistor pair are aligned along a line.

9. The semi-custom integrated circuit according to claim 8, wherein said first and second p-channel MIS transistor pair or said first and second n-channel MIS transistor pair are arranged adjacent to each other.

10. The semi-custom integrated circuit according to claim 8, wherein a plurality of said transistor units forms a digital circuit through an interconnection and a plurality of resistor units and capacitor units forms an analog circuit through an internal connection.

11. A semi-custom integrated circuit device comprising a basic cell, said basic cell including:

a transistor unit with a vertical width, and a resistor unit and capacitor unit provided on respective sides of said transistor unit, said resistor and capacitor units having vertical widths which are the same as said vertical width of the transistor unit, said capacitor unit including a first electrode formed on a first insulating film which covers a semiconductor substrate, a second electrode, and a second insulating film formed between said first and second electrodes, said first and second electrodes having respective terminal portions.

12. The semi-custom integrated circuit device according to claim 11, wherein the resistor unit is provided on the left side of the transistor unit, and the capacitor unit is provided on the right side of the transistor unit.

13. The semi-custom integrated circuit device according to claim 11, wherein a plurality of said basic cells are arranged in one column and having said resistor, transistor, and capacitor units respectively aligned in a vertical direction, and wherein a plurality of said basic cells are arranged in an adjacent column in a horizontal direction and aligned with said one column of said basic cells.

14. The semi-custom integrated circuit device according to claim 11, wherein the resistor unit is provided on the right side of the transistor unit, and the capacitor unit is provided on the left side of the transistor unit.

15. A semi-custom integrated circuit device comprising a first basic cell and second basic cell, said first basic cell including:

a transistor unit with a vertical width, a resistor unit provided on the left side of the transistor unit, and a capacitor unit provided on the right side of the transistor unit, and said resistor and capacitor units having vertical widths which are the same as the vertical width of the transistor unit, and said second basic cell including:

a transistor unit with a vertical width, a resistor unit provided on the right side of the transistor unit, and a capacitor unit provided on the left side of the transistor unit, said resistor and capacitor units having vertical widths which are the same as the vertical width of the transistor unit, said capacitor unit including a first electrode formed on a first insulating film which covers a semiconductor substrate, a second electrode, and a second insulating film formed between said first and second electrodes, said first and second electrodes having respective terminal portions.

16. The semi-custom integrated circuit device according to claim 15 wherein a plurality of said first basic cells is arranged in one column so that they are aligned with each other and a plurality of said second basic cells is arranged in the adjacent column so that they are aligned with each other.

17. The semi-custom integrated circuit device according to claim 15, wherein a plurality of said first and second basic cells are arranged in turn in one column so that they are aligned with each other.

18. A semi-custom integrated circuit device comprising a first basic cell and second basic cell said, first basic cell including:
a transistor unit with a vertical width, and
a resistor unit provided on both sides of the transistor unit,
said resistor unit having a vertical width which is the same as said vertical width of the transistor unit, and
said second basic cell including:
a transistor unit with a vertical width, and
a capacitor unit provided on both sides of the transistor unit,
said capacitor unit having a vertical width which is the same as said vertical width of the transistor unit, said capacitor unit including a first electrode formed on a first insulating film which covers a semiconductor substrate, a second electrode, and a second insulating film formed between said first and second electrodes, said first and second electrodes having respective terminal portions.

19. The semi-custom integrated circuit device according to claim 18, wherein a plurality of said first and second basic cells are arranged in turn in one column and in the adjacent column so that they are aligned with each other and an alternative order of said first and second basic cells in one column is shifted from that in the adjacent column by one basic cell.

20. The semi-custom integrated circuit device according to claim 18, wherein a plurality of said first and second basic cells are arranged in one column so that they are aligned with each other and said first basic cell in one column corresponds to said first basic cell in the adjacent column and said second basic cell in one column corresponds to said second basic cell in the adjacent column.

21. The semi-custom integrated circuit device according to claim 11, wherein an array of said basic cells forms an operation amplifier.

22. The semi-custom integrated circuit device according to claim 11, wherein said transistor unit, resistor unit and capacitor unit in said basic cell are aligned in a vertical and horizontal direction.

23. A semi-custom integrated circuit device comprising a basic cell;
said basic cell including:
a transistor unit with a vertical width, and
a resistor unit and a capacitor unit provided on respective sides of said transistor unit, said resistor and capacitor units having vertical width of an integer times said vertical width of the transistor unit, said capacitor unit including a first electrode formed on a first insulating film which covers a semiconductor substrate, a second electrode, and a second insulating film formed between said first and second electrodes, said first and second electrodes having respective terminal portions.

24. A semi-custom integrated circuit device comprising a basic cell, said basic cell including:
a transistor unit with a vertical width, and
a resistor unit and capacitor unit provided on respective sides of said transistor unit, said resistor and capacitor units each having a vertical width which is equal to one of: (a) an integer times half of the vertical width of the transistor unit, (b) an integer times the vertical width of the transistor unit, and (c) the vertical width of the transistor unit, said capacitor unit including a first electrode formed on a first insulating film which covers a semiconductor substrate, a second electrode, and a second insulating film formed between said first and second electrodes, said first and second electrodes having respective terminal portions.

25. The semi-custom integrated circuit device according to claim 24, wherein said transistor unit is formed in a transistor region, and said resistor and capacitor units are formed on a wiring region provided on the side of said transistor region.

* * * * *